United States Patent
Mearini et al.

(10) Patent No.: US 7,037,370 B2
(45) Date of Patent: May 2, 2006

(54) FREE-STANDING DIAMOND STRUCTURES AND METHODS

(76) Inventors: Gerald T. Mearini, 18800 Shaker Blvd., Shaker Heights, OH (US) 44122; James A. Dayton, Jr., 10423 Lake Ave., Cleveland, OH (US) 44102

( * ) Notice: Subject to any disclaimer, the term of this patent is extended or adjusted under 35 U.S.C. 154(b) by 29 days.

(21) Appl. No.: 10/772,444

(22) Filed: Feb. 6, 2004

(65) Prior Publication Data
US 2004/0154526 A1    Aug. 12, 2004

Related U.S. Application Data

(60) Provisional application No. 60/445,237, filed on Feb. 6, 2003, provisional application No. 60/494,089, filed on Aug. 12, 2003, provisional application No. 60/494,095, filed on Aug. 12, 2003.

(51) Int. Cl.
C30B 25/14 (2006.01)

(52) U.S. Cl. .............. 117/68; 117/75; 117/84; 117/89

(58) Field of Classification Search .......... 117/68, 117/75, 89, 84
See application file for complete search history.

(56) References Cited

U.S. PATENT DOCUMENTS

| | | | |
|---|---|---|---|
| 5,944,573 A | 8/1999 | Mearini et al. | |
| 6,001,432 A | 12/1999 | Yamazaki et al. | |
| 6,042,900 A | 3/2000 | Rakhimov et al. | |
| 6,110,541 A | 8/2000 | Lee et al. | |
| 6,132,278 A | 10/2000 | Kang et al. | |
| 6,244,212 B1 | 6/2001 | Mearini et al. | |
| 6,301,333 B1 | 10/2001 | Mearini et al. | |
| 6,475,355 B1 | 11/2002 | Mearini et al. | |
| 6,521,149 B1 | 2/2003 | Mearini et al. | |
| 6,656,444 B1 | 12/2003 | Pinneo | |
| 6,686,696 B1 | 2/2004 | Mearini et al. | |
| 2002/0012746 A1 | 1/2002 | Mearini et al. | |
| 2002/0125827 A1 | 9/2002 | Mearini et al. | |

OTHER PUBLICATIONS

"An In-situ Heating Study of Hydrogen Containing Absorbates on Polycrystalline Diamond Surfaces Using Elastic Recoil Detection," C A. Zorman, G. T. Mearini and R. W. Hoffman, Diam. And Rel. Mat. 9, 1518-1523 (2000).

"Field Emission from Gated Diamond Arrays," W. Mueller, H. S. Dewan, H. Chen, G. T. Mearini and I. L. Krainsky, Applied Surface Science, vol. 146, pp. 328-333, (1999).

(Continued)

*Primary Examiner*—Felisa Hiteshew
(74) *Attorney, Agent, or Firm*—Duane Morris LLP

(57) ABSTRACT

The present invention is directed in one aspect to methods of making free-standing, internally-supported, three-dimensional objects having an outer surface comprising a plurality of intersecting facets wherein a sub-set of the intersecting facets have a diamond layer of substantially uniform thickness. The diamond layer may be formed by chemical vapor deposition (CVD) over the surface of a substrate that has been fabricated to form a mold defining the sub-set of intersecting facets. A backing layer may be formed over at least a portion of the exposed diamond layer to enhance the rigidity of the layer when the substrate is removed.

34 Claims, 1 Drawing Sheet

OTHER PUBLICATIONS

Figure 1:
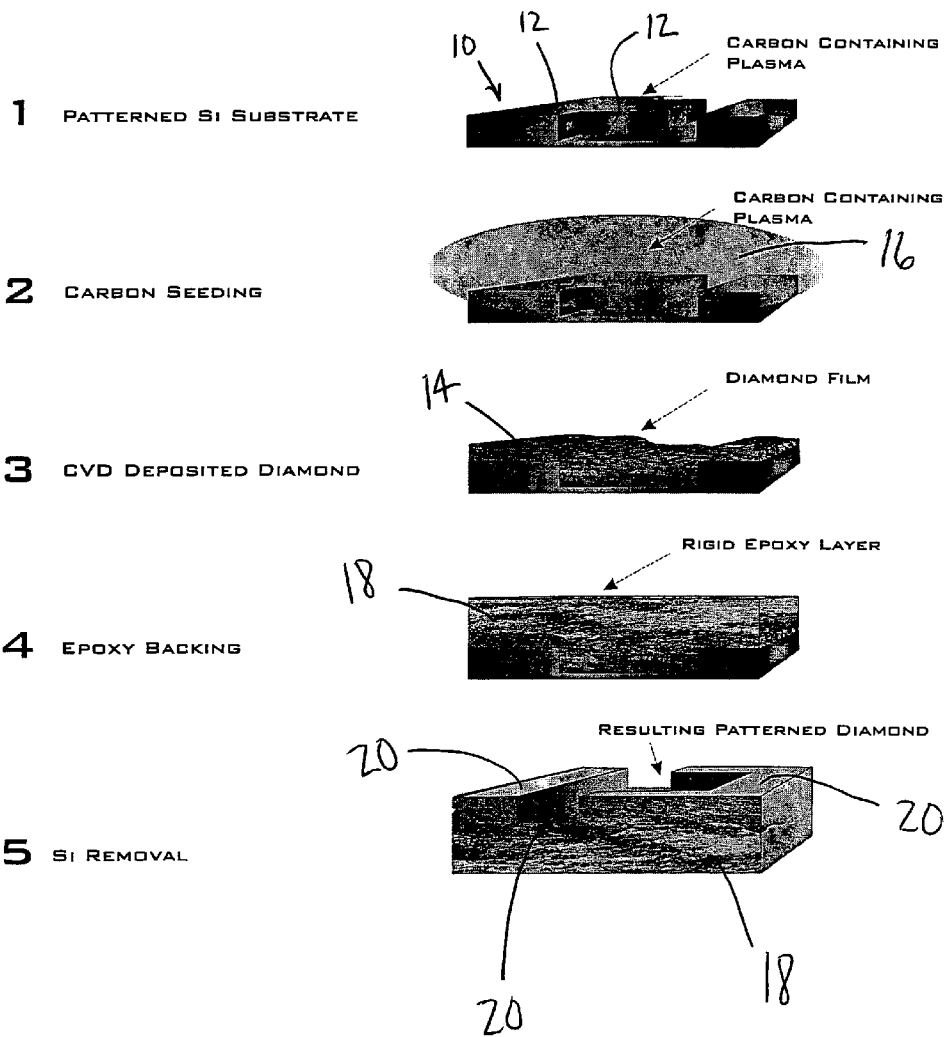

"Auger Electron Spectroscopy of the Hydrogen Terminated Chemical Vapor Deposited Diamond Surface," I. L. Krainsky, G. T. Mearini and V. M. Asnin, Appl. Phys. Lett., 68(14), 2017-2019, Apr. (1996).

"Negative-Electron-Affinity Effect on the Surface of Chemical Vapor Deposited Diamond Polycrystalline Films," I. L. Krainsky, V. M. Asnin, G. T. Mearini, and J. A. Dayton, Jr, Phys. Res. B 53, Rapid Communications, R7650, Mar. (1996).

"Electron Emission Observations From As-Grown and Vacuum-Coated Chemical Vapor Deposited Diamond," A. Lamouri, Y. Wang, G. T. Mearini, I. L. Krainsky, J. A. Dayton, Jr., and W. Mueller, J. Vac. Sci. and Tech., B 14(3), 2046-2049, May/Jun. (1996).

"Effects of Surface Treatment on Secondary Electron Emission from CVD Diamond Films," G. T. Mearini, I. L. Krainsky, J. A. Dayton, Jr., C. Zorman, Y. Wang, and A. Lamouri, Diamond Films and Tech., 5(6), 339-351 (1995).

"High Emission CsI Coated Diamond Dynodes for an Electron Multiplier," G. T. Mearini, I. L. Krainsky, J. A. Dayton, Jr., Proc. of Third Int. conf. on the Applications of Diamond Films and Rel. Materials, Aug. 21-24, NIST Special Publication 885 (1995) 13.

"Electron Emission Observations From As-Grown and Vacuum-Coated Chemical Vapor Deposited Diamond," A. Lamouri, G. T. Mearini, Yaxin Wang, and R E. Kusner, Proc. of the Third Int. Conf. on the Applications of Diamond Films and Rel. Materials, Aug. 21-24, NIST Special Publication 885 (1995) 61.

"Investigation of Secondary Electron Emission from CVD Diamond Films for Crossed-Field Device Applications," G. T. Mearini, I. L. Krainsky, and J. A. Dayton, Jr., Proc. of the First Workshop on Crossed-Field Devices, University of Michigan, Ann Arbor, MI (1995) 115-124.

"Electron Emission Observations From As-Grown and Vacuum Coated CVD Diamond," A. Lamouri, Yaxin Wang, G. T. Mearini, I. L. Krainsky, and J. A. Dayton, Jr., Proc. of the International Vacuum Microelectronics Conference, Jul. 29-Aug. 4, Portland, OR (1995) 310-314.

"Stable Secondary Electron Emission from CVD Diamond Films Coated With Alkali-Halides," G.T. Mearini, I.L. Krainsky, J.A. Dayton, Jr., Yaxin Wang, Christian A. Zorman, John C. Angus, RW. Hoffman, and D.F. Anderson, Appl. Phys. Lett., 66(2), 242-244 (1995).

"Stable Secondary Electron Emission Observations from CVD Diamonds," G.T. Mearini, I.L. Krainsky, I.A. Dayton, Jr., Yaxin Wang, Christian A. Zorman, John C. Angus, and R.W. Hoffman, Appl. Phys. Lett., 65(21), 2702-2704 (1994).

"Fabrication of an Electron Multiplier Utilizing Diamond Films," G. T. Mearini, I. L. Krainsky, J. A. Dayton, Jr., Y. X. Wang, R. Ramesham, and M. F. Rose, Thin Solid Films, 253(1), 151-156 (1994).

"Investigation of Diamond Films for Electronic Devices," G. T. Mearini, I. L. Krainsky, and J. A Dayton, Conference Record, The 1994 Tri-Service/NASA Cathode Workshop, 135-138 (1994).

"Investigation of Diamond Films for Electronic Devices," G. T. Mearini, I. L Krainsky, and J. A. Dayton, Jr., Surf. and Int. Anal., 21(2), 138-143 (1994).

"Effect of Hydrogen on the Properties of Polycrystalline Diamond Thin Films," R. Ramesham, M. F. Rose, R. F. Askew, T. L Bekker, J. A Dayton, Jr., I. L Krainsky, G. T. Mearini, D. File, A. S. Gilmour, Jr., and V. Ayers, Surf, and Coatings Technol., 64, 81-86 (1994).

"Investigation of Applications of Diamond Films in Microwave Tubes," T. L Bekker, A. S. Gilmour, Jr., V. M. Ayers, D. M. File, J. A Dayton, Jr., I. L Krainsky, G. T. Mearini, M. F. Rose and R. Ramesham, Report Naval Surface Warfare Center, Crane Division through Port Hueneme Division, Funded by MIPR to NASA Grant NAGW-1192-CCDS-AD, Auburn University.

"Observations of Secondary Electron Emission From Diamond Films," T. L Bekker, J. A.Dayton. Jr., A. S. Gilmour, Jr., I. L Krainsky, M. F. Rose, R. Rameshan, D. File, and G. T. Mearini, IEDM IEEE Technical Digest, 949-952 (1992).

"Three-Dimensional Finite Element Analysis of Thin-Film Stresses Using ALGOR Personal-Computer-Based Software," D. Krus, G. T. Mearini, K. Chaffee, and R. W. Hoffman, J. Vac Sci. Technol A9(4), 2488 Jul./Aug. (1991).

FREE-STANDING DIAMOND STRUCTURES AND METHODS

CLAIM OF PRIORITY

This application claims the benefit of the filing date priority of U.S. Provisional Application No. 60/445,237 filed Feb. 6, 2003; No. 60/494,089 filed Aug. 12, 2003; and No. 60/494,095 filed Aug. 12, 2003.

BACKGROUND OF THE INVENTION

The present invention relates to free-standing objects having laboratory grown diamond surfaces and methods for fabricating such objects. More particularly, the present invention is directed to such objects and methods wherein the outer surface of the object includes a plurality of intersecting facets having a diamond layer.

Diamond is one of the most technologically and scientifically valuable materials found in nature due to its combination of high resistance to thermal shock, extreme hardness, excellent infrared transparency, and excellent semiconductor properties.

Diamond has the highest known isotropic thermal conductivity and a relatively low expansion coefficient thus providing it with desirable resistance to thermal shock. Because of these properties, diamond has found increasing use as a thermal management material in electronic packaging of devices such as high power laser diodes, multichip modules, and other microelectronic devices.

Diamond is also the hardest known material and has desirable resistance to abrasion. Thus diamond components and coatings have found increasing use as wear resistance elements in various mechanical devices and in cutting and grinding tools. Diamond is also highly resistant to corrosion.

Diamond is also a good electrical insulator, but can be synthesized to be electrically conducting by the addition of certain elements such as boron to the growth atmosphere. Diamond is also used in many semiconductor devices including high-power transistors, resistors, capacitors, FET's, and integrated circuits.

The scarcity and high cost of natural diamond has prohibited its widespread commercial use. However, the development of various methods for synthesizing diamond has made the widespread commercial use of diamond possible. The most commercially promising method for synthesizing diamond includes the growth of diamond by chemical vapor deposition (CVD).

Diamond synthesis by CVD has become a well established art. It is known that diamond coatings on various objects may be synthesized, as well as free-standing objects. Typically, the free-standing objects have been fabricated by deposition of diamond on planar substrates or substrates having relatively simple cavities formed therein. For example, U.S. Pat. No. 6,132,278 discloses forming solid generally pyramidal or conical diamond microchip emitters by plasma enhanced CVD by growing diamond to fill cavities formed in the silicon substrate. However, there remains a need for methods of making free-standing, internally-supported, three-dimensional objects having an outer surface comprising a plurality of intersecting facets (planar or non-planar), wherein at least a sub-set of the intersecting facets have a diamond layer.

Accordingly, it is an object of the present invention to obviate many of the deficiencies in the prior art and to provide novel methods of making free-standing structures having diamond surfaces.

It is another object of the present invention to provide novel methods of making structures using diamond CVD.

It is yet another object of the present invention to provide novel structures formed by diamond CVD.

It is still another object of the present invention to provide novel methods of making free-standing structures having an exposed diamond surface.

It is a further object of the present invention to provide novel methods of making internally-supported structures having an exposed diamond surface.

These and many other objects and advantages of the present invention will be readily apparent to one skilled in the art to which the invention pertains from a perusal of the claims, the appended drawings, and the following detailed description of the preferred embodiments.

DETAILED DESCRIPTION OF THE DRAWINGS

FIG. 1 is an illustration showing the steps of the preferred embodiment of the present invention.

DESCRIPTION OF PREFERRED EMBODIMENTS

In one aspect, the present invention is directed to methods of making free-standing, internally-supported, three-dimensional objects having a diamond layer on at least a portion of the outer surface of the object. The diamond layer may be formed by any method of synthesizing diamond such as high-pressure, high-temperature (HPHT) methods or CVD. In accordance with the preferred embodiment of the present invention, the diamond is synthesized by CVD.

In the diamond CVD methods according to the present invention, a mixture of hydrogen and carbon-containing gases is activated to obtain a region of gas-phase non-equilibrium adjacent the substrate on which the diamond will be grown. The carbon-containing gas may be selected from a large variety of gases including methane, aliphatic and aromatic hydrocarbons, alcohols, ketones, amines, esters, carbon monoxide, carbon dioxide, and halogens. Methane is used according to the preferred embodiment of the invention.

The mixture of gases is energized to obtain a region of gas-phase non-equilibrium adjacent the substrate on which the diamond will be grown. A variety of gas-phase activation techniques may be used and these techniques may be categorized as either hot-filament CVD, plasma-assisted CVD, or flame CVD. In plasma-assisted CVD the plasma may be generated by a number of energy sources including microwave, radio-frequency, or direct current electric fields.

The substrate may be any material suitable for nucleating and growing diamond such as semiconductor, metal, and insulator materials. Generally, the nucleation rates are much higher on carbide forming substrates (e.g., Si, Mo, and W) than on substrates that do not form carbides. According to the preferred embodiment of the present invention, silicon substrates are used in view of the desirable nucleation rates and well known fabrication techniques of silicon.

The surface of the substrate on which the diamond will be grown may be pretreated by various techniques to enhance diamond nucleation and improve the nucleation density of diamond on the surface. Such methods may include (i) scratching, abrading, or blasting the surface with diamond particles or paste, (ii) seeding the surface with submicron powders such as diamond, silicon, or cBN, (iii) biasing the substrate, (iv) carburization, (v) pulsed laser irradiation, and (vi) ion implantation.

In accordance with the preferred embodiment of the present invention, a free-standing, internally-supported, three-dimensional object is provided having an outer surface comprising a plurality of intersecting facets wherein at least a sub-set of the intersecting facets have a diamond layer of substantially uniform depth. The term "facet" as used herein, includes a surface or face that is either planar or non-planar.

FIG. 1 illustrates the various steps of the preferred embodiment of the present invention. With reference to FIG. 1, a silicon substrate 10 is fabricated using conventional fabrication techniques to form a mold having an exposed surface 12 defining the sub-set of intersecting facets. A diamond layer 14 of generally uniform thickness is grown over the exposed surface 12 of the substrate 10 by any suitable method such as hot-filament CVD or plasma-assisted CVD.

The exposed surface 12 may be pretreated by any suitable technique to enhance the diamond nucleation and nucleation density on the exposed surface. Typically, the exposed surface is pretreated by seeding the surface with carbon atoms 16. The pretreatment of the exposed surface may be important in order to ensure growth of the diamond in the shape of the sub-set of facets which may be relatively complex.

In some instances, a backing layer 18 may be formed over at least portions of the exposed surface of the newly grown diamond layer to provide structural support to the diamond layer when the substrate is removed. Any material that will adhere to the exposed diamond and enhance the rigidity of the diamond layer 14 is suitable for the backing layer 18 (e.g., epoxy, plastic, viscous polymers that harden, glass, etc.). The backing layer may be electrically conductive or non-conductive as desired.

Once the backing layer 18 is formed as desired, the substrate 10 is removed to expose the surface 20 of the diamond layer 14 grown contiguous to the substrate which has been defined by the mold formed by the substrate. The substrate 10 may be removed by any suitable means such as chemical etching. The diamond layer 14 may then be treated as desired.

The free-standing objects made according to the present invention may find utility in a variety of applications such as backward wave oscillators, bi-polar plates for fuel cells, traveling wave tubes, microchannel plates, and a multitude of other devices having a surface comprising a plurality of intersecting facets wherein a sub-set of intersecting facets have a diamond layer of substantially uniform thickness.

While preferred embodiments of the present invention have been described, it is to be understood that the embodiments described are illustrative only and that the scope of the invention is to be defined solely by the appended claims when accorded a full range of equivalence, many variations and modifications naturally occurring to those of skill in the art from a perusal hereof.

What is claimed is:

1. A method of making a free-standing, internally-supported, three-dimensional object, an outer surface of the object comprising a plurality of intersecting facets, at least a sub-set of said intersecting facets having a diamond layer of substantially uniform depth, said method domprising the steps of:
   (a) providing a mold having an exposed surface defining the sub-set of intersecting facets;
   (b) growing a diamond layer of substantially uniform depth over the exposed surface;
   (c) depositing a backing layer over at least a portion of the diamond layer; and
   (d) removing the mold to expose the surface of the diamond layer grown immediately contiguous to the mold.

2. The method of claim 1 wherein the mold is a silicon substrate fabricated to define the sub-set of intersecting facets.

3. The method of claim 2 wherein the mold is removed by chemical etching.

4. The method of claim 1 further including the step of pretreating the exposed surface of the mold to enhance the growth of the diamond layer.

5. The method of claim 4 wherein carbon atoms are deposited on the exposed surface of the mold to enhance the growth of the diamond layer.

6. The method of claim 5 wherein the carbon atoms are deposited on the exposed surface of the mold by exposing the surface to a carbon containing plasma.

7. The method of claim 1 wherein the sub-set of intersecting facets includes planar facets.

8. The method of claim 1 wherein the sub-set of intersecting facets includes non-planar facets.

9. A method of fabricating a free-standing object comprising a three-dimensional structure covered by a diamond film having an exposed surface, said method comprising the steps of:
   growing a diamond film on a preselected exposed surface of a substrate;
   providing a backing on at least a portion of the grown diamond film; and
   removing the substrate to expose the diamond surface defined by the preselected surface of the substrate on which the diamond was grown.

10. The method of claim 9 wherein the substrate is silicon.

11. The method of claim 9 including the further step of pretreating the preselected exposed surface to enhance the growth of diamond thereon.

12. The method of claim 11 wherein a carbon seed layer is formed on the preselected exposed surface of the substrate.

13. The method of claim 9 wherein the preselected surface of the substrate includes the intersection of two facets.

14. A method of fabricating a free-standing, internally-supported, three-dimensional object, an outer surface of the object comprising a plurality of intersecting facets, at least a sub-set of said intersecting facets having an exposed diamond surface, said method comprising the steps of:
   growing a diamond film on a preselected exposed surface of a substrate;
   providing a backing layer covering at least a portion of the grown diamond film; and
   removing the substrate so that the exposed diamond surface is the surface grown immediately contiguous to the substrate.

15. The method of claim 14 wherein the substrate is silicon.

16. The method of claim 15 wherein the substrate is removed by chemical etching.

17. The method of claim 14 wherein the backing layer covers the entire diamond film.

18. The method of claim 14 wherein the backing layer is electrically conducting.

19. The method of claim 14 wherein the backing layer is electrically non-conducting.

20. The method of claim 19 wherein the backing layer is an epoxy.

21. The method of claim 14 including the further step of forming a carbon seed layer on the preselected exposed surface of the substrate to facilitate the growth of the diamond film thereon.

22. The method of claim 21 wherein the diamond seed layer is formed by exposing the preselected exposed surface of the substrate to a carbon containing activated gas.

23. The method of claim 22 wherein the diamond seed layer is formed by:
grounding the substrate;
providing ionized carbon atoms; and
exposing the preselected exposed surface of the substrate to the ionized carbon atoms.

24. The method of claim 22 wherein the activated gas is a plasma.

25. The method of claim 24 wherein the plasma is formed by energizing a mixture of hydrogen and hydrocarbon gases.

26. The method of claim 22 wherein the diamond seed layer is formed by chemical vapor deposition.

27. The method of claim 14 wherein the diamond is grown by chemical vapor deposition.

28. The method of claim 14 wherein the intersecting facets include planar facets.

29. The method of claim 14 wherein the intersecting facets include non-planar facets.

30. The method of claim 14 wherein the exposed diamond surface forms the surface of a waveguide.

31. The method of claim 14 wherein the object is a bi-polar plate for a fuel cell.

32. A method of making a free-standing, internally-supported, three-dimensional object, an outer surface of the object comprising a plurality of intersecting facets, at least a sub-set of said intersecting facets having a diamond layer of substantially uniform depth, said method comprising the steps of:
(a) fabricating a silicon substrate to provide a molding surface defining the sub-set of intersecting facets;
(b) seeding the molding surface of the substrate with carbon;
(c) growing a diamond layer of substantially uniform depth over the molding surface of the substrate;
(d) forming an internally-supporting backing layer over the diamond layer; and
(e) chemically etching the substrate to expose the surface of the diamond layer grown contiguous to the molding surface of the substrate.

33. The method of claim 32 wherein molding surface is seeded by chemical vapor deposition.

34. The method of claim 32 wherein the diamond layer is grown by chemical vapor deposition.

* * * * *